United States Patent
Zhang

(10) Patent No.: US 7,061,774 B2
(45) Date of Patent: Jun. 13, 2006

(54) COMPUTER BOARD WITH DUAL SHIELD HOUSING AND HEAT SINK EXPANSION ZONE APPARATUSES

(76) Inventor: Franklin Zhigang Zhang, 4808 Laurette St., Torrance, CA (US) 90503

(*) Notice: Subject to any disclaimer, the term of this patent is extended or adjusted under 35 U.S.C. 154(b) by 0 days.

(21) Appl. No.: 10/015,307

(22) Filed: Dec. 12, 2001

(65) Prior Publication Data

US 2002/0075640 A1    Jun. 20, 2002

Related U.S. Application Data

(60) Provisional application No. 60/256,414, filed on Dec. 18, 2000.

(51) Int. Cl.
*H05K 9/00*    (2006.01)

(52) U.S. Cl. .................. 361/818; 361/800; 361/816; 174/35 R; 174/51

(58) Field of Classification Search ............ 361/816, 361/818, 800, 752, 797, 704, 697, 792, 788, 361/794; 174/35, 51 R, 35 R, 51, 259, 263; 316/816

See application file for complete search history.

(56) References Cited

U.S. PATENT DOCUMENTS

| | | | | |
|---|---|---|---|---|
| 5,378,169 A | * | 1/1995 | Volz et al. ................. 439/376 |
| 5,559,676 A | * | 9/1996 | Gessaman ................. 361/752 |
| 5,596,487 A | * | 1/1997 | Castaneda et al. .......... 361/814 |
| 5,639,989 A | * | 6/1997 | Higgins, III ........... 174/35 MS |
| 5,838,551 A | * | 11/1998 | Chan ........................ 361/818 |
| 5,867,371 A | * | 2/1999 | Denzene et al. ............ 361/816 |
| 5,907,474 A | * | 5/1999 | Dolbear ..................... 361/705 |
| 5,907,478 A | * | 5/1999 | Watanabe .................. 361/807 |
| 5,982,038 A | * | 11/1999 | Toy et al. .................. 257/772 |
| 6,118,347 A | * | 9/2000 | Ohira ......................... 331/68 |
| 6,138,347 A | * | 10/2000 | Persson et al. ............. 29/836 |
| 6,192,577 B1 | * | 2/2001 | Larsson ..................... 29/840 |
| 6,362,974 B1 | * | 3/2002 | Lettang ..................... 361/790 |
| 6,504,243 B1 | * | 1/2003 | Andric et al. .............. 257/718 |
| 6,775,151 B1 | * | 8/2004 | Suzuki ..................... 361/788 |

* cited by examiner

*Primary Examiner*—Kamand Cuneo
*Assistant Examiner*—Hung S. Bui

(57) ABSTRACT

A compact computer system board 10 comprises dual on PCB expansion zones 11, 12, expansion connectors 113, 123 which can be connected to expansion boards. Once a expansion board is connected to the expansion connector 113 (123) in the on PCB expansion zone 11 (12) to extent the application of the system 10, a metal housing cover 20 will be mounted above the on PCB expansion zone 11(12). The shield expansion apparatus formed by on PCB expansion zone 11 (12) and metallic housing cover 20 isolates the electromagnetic interference between add-on expansion daughter card and the environment outside of the shield expansion apparatus. The metal housing cover 20 as well as the on PCB expansion zone 11 (12) function as the heat sink of the add-on expansion daughter card inside the apparatus. Dual complete EMI shield expansion apparatuses especially eliminate the cross interference and provide high heat dispassion for the system under the situation when there are two radio frequency application expansion boards installed onto the system board.

4 Claims, 2 Drawing Sheets

COMPUTER BOARD WITH DUAL SHIELD HOUSING AND HEAT SINK EXPANSION ZONE APPARATUSES

CROSS-REFERENCE TO RELATED APPLICATIONS

This application claims the benefit of the Provisional Patent Application Ser. No. 60/256,414 filed Dec. 18, 2000.

BACKGROUND

1. Field of Invention

This invention is concerned with a computer system board, specifically a computer system board with dual complete EMI shield and heat conduction housing solutions for critical environment applications.

2. Description of Prior Art

It is known in the art of the regular Personal Computer (PC) and industrial PC system board design, expansion slots are one of the key mechanisms on the board. They provide the hardware expandability of the system board. On a regular PC system board, ISA, PCI or PCMCIA slot can always be found. PC-104's interfaces were introduced to be the main expansion standard for stackable industrial PC. Add-on expansion daughter cards are mounted in to the expansion connectors/slots on the computer main system board/mother board for expanding the system functions. There is no strict requirement on the size of a regular PC system board. In art of computer system design, in order to eliminate the interference and having sufficient heat dissipation, the computer systems are designed with certain spacing and size to meet the requirements. To solve EMI and/or heat issues, the system board is usually designed in big size with sufficient spacing for the add-on expansion daughter cards. However, in the application cases where the hardware system sizes are limited, and the installation environment is critical such as outdoor application, and especially when there are RF circuitries and components in the system, the interference among the system board and add-on expansion daughter boards increases. Obviously, sufficient EMI proof means and heat conduction means are needed to be implemented, to ensure system function properly.

In the prior art of work, there are a variety of solutions to shield the components on a PCB, or shield a group of small assembly and then install them in a bigger PCB. Those designs provide a EMI shielding on the component level. However, on the system design level, especially, when an embedded computer system with different type of add-on expansion daughter cards, a system level EMI shield and heat conduction implementation is needed to ensure the whole system performance as well as keep the flexibility of the adaptation of different types of add-on expansion daughter cards.

Obviously, better solution is needed.

SUMMARY

The present invention provides a computer system board with dual complete EMI shield and heat conduction expansion apparatuses for space limited and critical application circumstance. The shield expansion apparatuses provide complete EMI shield and sufficient heat conduction for the add-on expansion daughter cards inside them. The shield expansion apparatus comprises an on PCB expansion zone, and a special shield metal housing cover with heat sink that covers the whole expansion zone after an expansion board is installed on to the system board. The expansion zone is a large copper clad ground plane on the PCB with connectors for connecting with add-on expansion daughter cards.

The metal housing cover and the on PCB shield expansion zone work together to conduct the heat generated by the expansion board sealed inside, and, also completely shield the electromagnetic wave interference between the add-on expansion daughter card and the environment outside of the shield expansion apparatus. In my example, dual shield expansion housing design with high heat sink especially eliminates the cross RF interference under the situation when there are two expansion boards doing radio frequency applications which are installed on to the system.

Objects and Advantages

Accordingly, several objects and advantages are achieved by providing shield expansion houses on the system board of my invention:

1) to provide a computer system board with add-on expansion daughter cards in a space limited environment with high reliability and stability by the complete shield expansion apparatuses of current invention;
2) to use the metal housing cover as well as the heat sink to provide high heat dispassion capability for the expansion board;
3) to shield the electromagnetic wave interference among the add-on expansion daughter cards and the system board.

The forgoing features and advantages of the present invention can be appreciated more fully from the following description, with references to the accompanying drawings in which.

DESCRIPTION—PREFERRED EMBODIMENT

Figure 1:
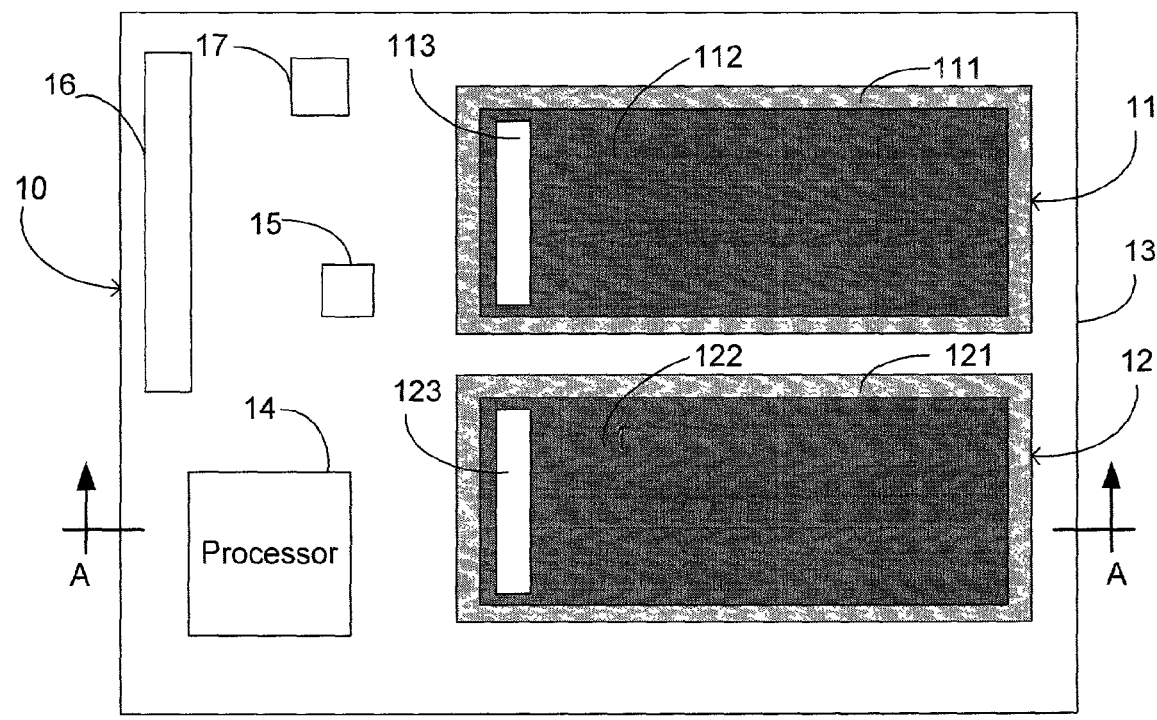
FIG. 1 is a diagrammatic view of a system board design with the present invention.

FIG. 1 is a diagrammatic view of a system board design with the present invention. As shown in this embodiment, the computer system board 10 comprises a PCB 13, a processor 14, the connector 16 (optional), other ICs 15,17 and on PCB expansion zones 11 & 12. The connector 16 makes it possible for the system level expansion with other system boards (not shown). Through this connector 16, more system boards can be stackable, thus it allows more expansion boards to fit into a particular space and can process more applications.

On the system board 10, two on PCB shield expansion zones 11, 12 comprise shield areas 112, 122 which are part of ground copper clad laminate on the PCB with insulation; soldering zones 111&121, which can be soldered together with a shield metal housing cover (referring to FIG. 2 the shield metal housing cover 20); and expansion connectors 113, 123. Once the shield metal housing cover 20 is mounted on to the shield expansion zone 11 or 12, they can form a complete shield house with heat sink feature. The expansion boards connecting with the system board through the expansion connectors 113 or 123 process the according applications while they are isolated from electromagnetic wave interference with the electronics outside the house. Meanwhile, electronics sealed inside the house have a good heat distribution environment.

Figure 1A:
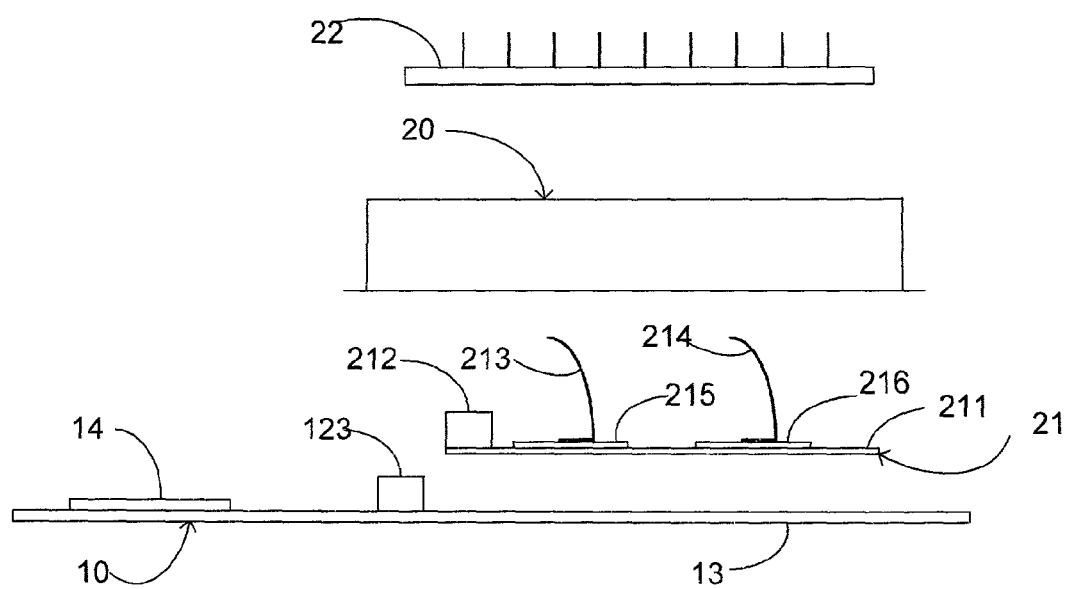
FIG. 1A is a cut away side view of the system board taken along line A—A of FIG. 1; and the side view of the expansion board, the shield metal housing cover and the add-on extra heat sink.

FIG. 1A is a cut away side view of the system board taken along line A—A of FIG. 1; and the side view of the expansion board, the shield metal housing cover and the add-on extra heat sink. As shown, the expansion board 21 with connector 212 can be plugged into the expansion connector 123 and mounted on to the system board 10. The components 215 & 216, which need high heat distribution, have the heat conductor blades 213 &214 on them. After the expansion board 21 is mounted on the system board 10, the shield metal housing cover 20 can cover the shield expansion zone 12 and be mounted on the system board also. The heat conductor blades 213 and 214 touch the shield metal housing cover 20 and conduct the heat from the IC 215 and 216; thus, the shield metal housing cover 20 becomes the heat sink of the whole expansion board. For heavy duty expansion board, which may generates more heat, an add-on, extra heat sink 22 is attached to the shield metal housing cover 20 to provide extra heat distributing ability for the expansion board.

Figure 2:
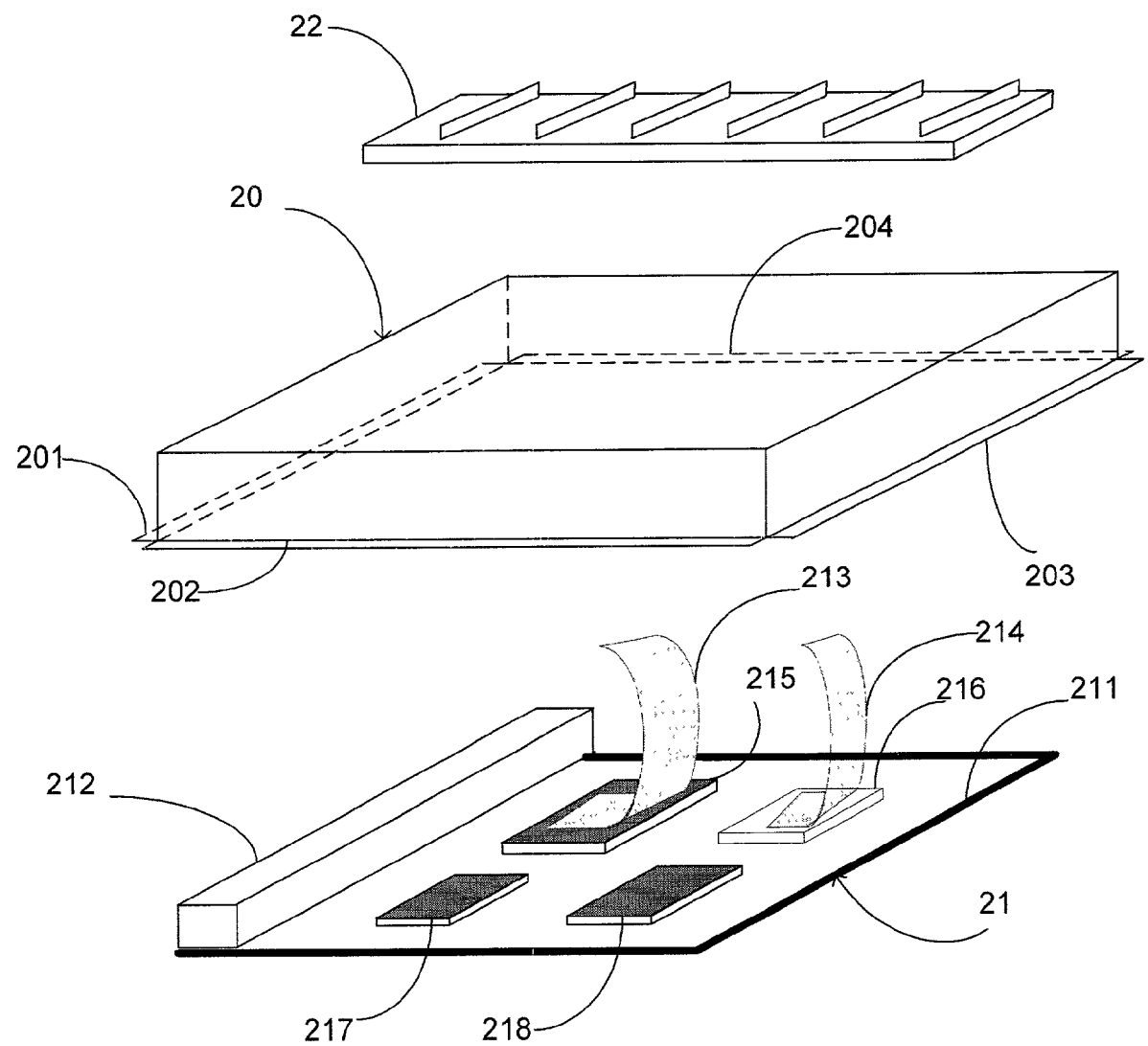
FIG. 2 is an enlarged view of the shield metal housing cover and the expansion board.

FIG. 2 is an enlarged view of the shield metal housing cover and expansion board. As shown in this embodiment, the shield metal housing cover 20 is an open metal box with four small soldering edges 201,202,203 and 204, which can be soldered on to the soldering zone (referring to 111 or 121 of FIG. 1) of the system board 10. This forms the complete shield house for the expansion board 21. In some special cases, there may be holes need on the shield metal housing cover in order for some of the circuit of the expansion board 21 to extend out of the shield metal housing cover. The expansion board 21 is an individual electronic circuit board, which can perform certain functions; for example a LAN card to provide networking functions for the system board. The expansion board 21 comprises a PCB 211 and a connector 212 that can be connected to the expansion connector (referring to 113 and 123 of FIG. 1) in the shield expansion zone (referring to 11 and 12 of the FIG. 1). Once the expansion board is sealed in to the shield house, the airflow inside the house is the heat conductor for all the components. On the PCB 211, there are ICs 215,216,217, and 218. Heat conduct blades 213 and 214 are added on to IC 215 & 216 to provide better heat distribution. An add-on extra hest sink 22 is added on to the shield metal housing cover 20 when better heat distribution is required.

Conclusion, Ramifications, and Scope

Accordingly, the reader can see, I've provided a computer system board with dual complete shield expansion apparatuses. The computer system board and its complete shield expansion apparatuses of current invention has a compact size and can be easily fit into small application environment. The complete shield expansion apparatuses of current invention enable versatile system hardware expansions by eliminating EMI and providing good heat dispassion for the add-on expansion daughter cards. Dual shield expansion housing design especially benefit to eliminate the cross interference with high heat sink ability under the situation when there are two radio frequency application expansion boards installed on to the system board.

Although the description above contains much specificity, these should not be construed as limiting the scope of the invention but as merely providing illustrations of some of the presently preferred embodiments of this invention. Various other embodiments and ramifications are possible within its scope. For example:

For stackable system board, it allows more expansion boards to fit into a particular space and can process more applications.

One system board can be designed with more than two shield expansion apparatuses.

A system board may comprise multiple expansion apparatuses on both side of the PCB.

A system board may comprise different size of the expansion apparatuses.

For special type of expansion boards, an expansion apparatus may comprise more than one connector and other means to joint the expansion boards with the system board.

A shield expansion apparatus may have some holes conducting circuit from inside to outside.

Thus the scope of the invention should be determined by the appended claims and their legal equivalents, rather than by the examples given.

What is claimed is:

1. A computer system board expansion housing apparatus for add-on expansion daughter board with complete EMI shield comprising:

an on computer system board PCB shield zone (PCB shield zone), a metallic expansion housing cover (housing cover), and an add-on expansion daughter board, wherein, said on computer system board PCB shield zone is a copper clad ground plane PCB area fabricated on computer system board PCB as part of the computer system board PCB with solderable surrounding zone where said housing cover can be soldered on to;

whereby, the non-solderable area of said copper clad ground plane of said PCB shield zone is covered with isolation means;

whereby, said PCB shield zone is installed with at least one connector means for installation of said add-on expansion daughter board;

whereby, said connector means providing mechanical support for attaching the said add-on expansion daughter board to said computer system board with necessary help of other mounting means;

wherein, said metallic expansion housing cover is a metallic cover box with an open base that can be soldered onto the corresponding solderable surrounding zone of said PCB shield zone;

whereby, after said add-on expansion daughter board is mounted onto said PCB shield zone, said housing cover is soldered onto said PCB shield zone covering said add-on expansion daughter board; and whereby, said housing cover is soldered onto said PCB shield zone forming a complete metallic shield apparatus for said add-on expansion daughter card and other electronics inside the apparatus.

2. A complete EMI shield and heat conduction expansion housing apparatus for add-on expansion daughter board for computer system board comprising:

an on computer system board PCB shield zone (PCB shield zone), a metallic expansion housing cover (housing cover), an add-on expansion daughter board, and a plurality of heat conduction means, wherein, said on computer system board PCB shield zone is a copper clad ground plane PCB area fabricated on computer system board PCB as part of the computer system board PCB with solderable surrounding is zone where said housing cover can be soldered on to;

whereby, the non-solderable area of said copper clad ground plane of said PCB shield zone is covered with isolation means;

whereby, said PCB shield zone is installed with at least one connector means for installation of said add-on expansion daughter board;

whereby, said connector means providing mechanical support for attaching the said add-on expansion daughter board to said computer system board with necessary help of other mounting means;

wherein, said metallic expansion housing cover is a metallic cover box with an open base that can be soldered onto the corresponding solderable surrounding zone of said PCB shield zone;

whereby, after said add-on expansion daughter board is mounted onto said PCB shield zone, said housing cover is soldered unto said PCB shield zone covering said add-on expansion daughter board;

whereby, said housing cover is soldered onto said PCB shield zone forming a complete metallic shield apparatus for said add-on expansion daughter card and other electronics inside the apparatus;

whereby, said heat conduction means are attached between said add-on expansion daughter board and said metallic expansion housing;

whereby, said apparatus utilizing the said metallic expansion housing cover as heat sink; and whereby, said heat conduction means conducting heat from said add-on expansion daughter card to said metallic expansion housing cover.

3. A computer system board with a plurality of add-on expansion daughter boards and correspondence complete EMI shield expansion housing apparatuses comprising:

a computer system board, a plurality of add-on expansion daughter boards, a plurality of metallic expansion housing cover (housing cover), and a plurality of optional heat conduction means, Wherein, said computer system board has a plurality of on computer system board PCB shield zone (PCB shield zone);

wherein, said a plurality of PCB shield zone are a plurality of copper clad ground plane PCB area fabricated on computer system board PCB as part of the computer system board PCB with solderable surrounding zone each where said housing cover can be soldered on to;

whereby, the non-solderable area of said copper clad ground plane of said PCB shield zone is covered with isolation means;

whereby, said each PCB shield zone installed with at least one connector means for installation of said add-on expansion daughter board;

whereby, said connector means providing mechanical support for attaching the said add-on expansion daughter board to said computer system board with necessary help of other mounting means;

wherein, said metallic expansion housing cover is a metallic cover box with an open base that can be soldered onto the corresponding solderable surrounding zone of said PCB shield zone;

whereby, after said add-on expansion daughter board is mounted onto said PCB shield zone, said housing cover is soldered onto said PCB shield zone covering the said add-on expansion daughter board;

whereby, said housing cover is soldered onto said PCB shield zone forming a complete metallic shield apparatus (expansion housing apparatuses) for said add-on expansion daughter card and other electronics inside the apparatus;

whereby, said heat conduction means may be applied when necessary;

whereby, said heat conduction means are attached between said add-on expansion daughter board and said metallic expansion housing;

whereby, said apparatus utilizing the said metallic expansion housing cover as heat sink;

whereby, said heat conduction means conducting heat from said add-on expansion daughter card to said metallic expansion housing cover;

whereby, said computer system board having multiple expansion features of expansion daughter boards;

whereby, the electronics inside one said expansion housing apparatuses are not interfering among other the electronics inside the other said expansion housing apparatuses; and whereby, the electronics inside a plurality of said expansion housing apparatuses are not interfering with other electronics on said computer systems board.

4. One computer system board according to claim 3, wherein the said computer system board has stackable connector means for stacking a plurality of said computer system board electronically and mechanically with helps of other mounting means.

* * * * *